US006255893B1

US 6,255,893 B1

(12) United States Patent
Dishongh et al.

(10) Patent No.: US 6,255,893 B1
(45) Date of Patent: Jul. 3, 2001

(54) METHOD AND APPARATUS FOR DETECTION OF ELECTRICAL OVERSTRESS

(75) Inventors: Terrance J. Dishongh, Hillsboro; David H. Pullen, Portland, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/348,795

(22) Filed: Jul. 7, 1999

(51) Int. Cl.[7] .................................................. H01H 37/76
(52) U.S. Cl. ........................ 327/525; 361/91.5; 361/104
(58) Field of Search ................................ 327/525, 77, 78, 327/89; 361/91.1, 91.2, 91.5, 90, 79, 86, 87, 93, 104

(56) References Cited

U.S. PATENT DOCUMENTS

| 5,949,632 | * | 9/1999 | Barreras, Sr. et al. | 361/90 |
| 6,028,755 | * | 2/2000 | Saeki et al. | 361/91.1 |
| 6,072,349 | * | 6/2000 | Pippin et al. | 327/307 |
| 6,087,889 | * | 7/2000 | Mok | 327/525 |

* cited by examiner

*Primary Examiner*—Jung Ho Kim
(74) *Attorney, Agent, or Firm*—Raymond J. Werner

(57) ABSTRACT

A circuit that senses changes in the electrical characteristics of one or more circuit elements and generates one or more signals based, at least in part, on the electrical characteristics that are sensed, is incorporated into an integrated circuit. In a further aspect of the present invention, the one or more signals generated by the circuit are indicative of the reliability of an electronic device into which an embodiment of the present invention is incorporated.

11 Claims, 5 Drawing Sheets

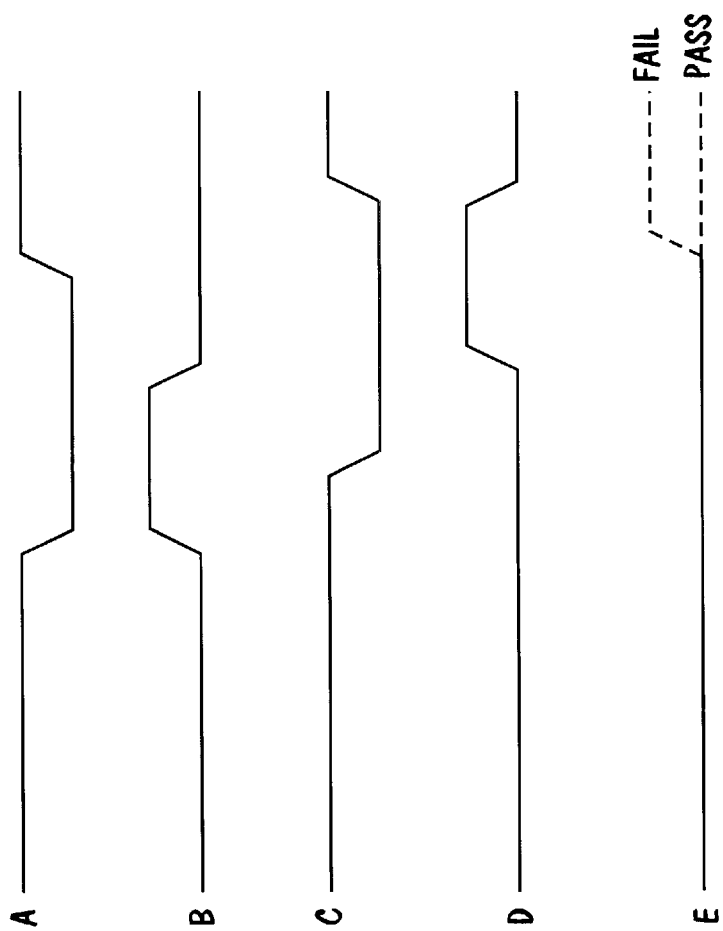

METHOD AND APPARATUS FOR DETECTION OF ELECTRICAL OVERSTRESS

BACKGROUND OF THE INVENTION

1. Field of the Invention

The invention relates generally to the detection of electrical overstress events in electronic devices, and more particularly to determination of the cause of overstress and determination of reliability degradation.

2. Background

Advances in semiconductor manufacturing technology have led to the integration of tens, and more recently hundreds, of millions of circuit elements, such as transistors, on a single integrated circuit (IC). To achieve such dramatic increases in the density of circuit components has required semiconductor manufacturers to scale down the physical dimensions of the circuit elements, as well as the interconnection structures used to connect the circuit elements into functional circuitry.

One consequence of scaling down the physical dimensions of circuit elements and interconnect structures is an increased sensitivity to electrical overstresses. This sensitivity is problematic because it reduces noise margins, and requires careful engineering of power supplies and clock signal generators. Additionally, because integrated circuits such as, for example, microprocessors, are worth more to consumers as their operating frequency increases, there is a growing tendency to overclock, or otherwise overstress such integrated circuits to obtain higher levels of performance. Voltage and frequency skewing by end users tends to cause a voltage overstress in the integrated circuit. Such skewing may also be referred to by terms such as overpowering and overclocking. Overstresses of this type may result in the operational failure of such an integrated circuit.

What is needed are methods and apparatus for determining if an integrated circuit has been subjected to overstress.

SUMMARY OF THE INVENTION

Briefly, a circuit that senses changes in the electrical characteristics of one or more circuit elements and generates one or more signals based, at least in part, on the electrical characteristics that are sensed, is incorporated into an integrated circuit.

In a further aspect of the present invention, the one or more signals generated by the circuit are indicative of the reliability of an integrated circuit into which an embodiment of the present invention is incorporated.

BRIEF DESCRIPTION OF THE DRAWINGS

FIG. 5 is a timing diagram illustrating the operation of the circuit of FIG. 4.

DETAILED DESCRIPTION

Figure 1:
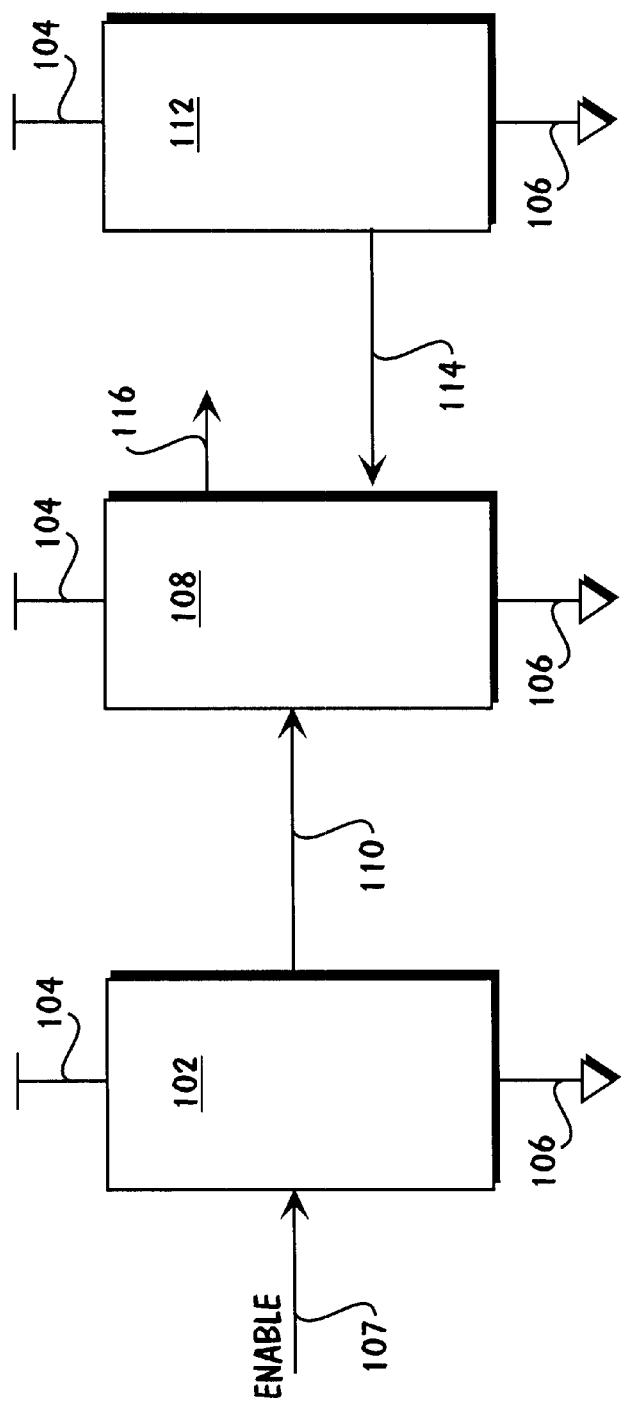
FIG. 1 is a block diagram of an electrical overstress (EOS) fuse sensor circuit in accordance with the present invention.

Reliability is an important aspect of modern electronic systems. In order to understand, and reduce or eliminate, failure mechanisms, integrated circuits are often subjected to failure analysis when they exhibit one or more modes of failure.

Manufacturers often devote significant resources to understanding specific failure modes in both factory line fallout and in customer returns. These resources cost both time and money in obtaining a root cause failure analysis. One of the problems associated with analyzing the cause of a failure in integrated circuits is that often a failed device will have metal interconnect lines melted together. In such circumstances it maybe difficult to ascertain the cause of the failure.

Additionally, by providing notice that overstress events have taken place, embodiments of the present invention permit replacement of integrated circuits with degraded reliability before a functional failure actually occurs.

Embodiments of the present invention can sense various overstress events, including but not limited to overclocking and overpowering. By providing information related to overstress events in an integrated circuit such as, for example, overclocking and overpowering, embodiments of the present invention facilitate maintenance of electronic systems, as well as failure analysis.

Terminology

The terms, chip, integrated circuit, monolithic device, semiconductor device, and microelectronic device, are often used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, such as aluminum (Al), copper (Cu), an alloy of Al and Cu, an alloy of Al, Cu and silicon (Si), tungsten (W), and nickel (Ni) are conductors that provide signal paths for coupling or interconnecting, electrical circuitry. Other conductors, both metal and non-metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal suicides are examples of other conductors.

The term "gate" is context sensitive and can be used in two ways when describing integrated circuits. As used herein, gate refers to a circuit for realizing an arbitrary logical function when used in the context of a logic gate. Gate refers to the insulated gate terminal of a three terminal FET when used in the context of transistor circuit configuration. Although a FET can be viewed as a four terminal device when the semiconductor body is considered, for the purpose of describing illustrative embodiments of the present invention, the FET will be described using the traditional gate-drain-source, three terminal model.

The term vertical, as used herein, means substantially perpendicular to the surface of a substrate.

When a logical signal name herein includes "#" as a suffix, then that signal is low active. That is, the signal goes to a logical low state when it is asserted, and goes to a logical high state when it is deasserted.

Referring to FIG. 1, a block diagram illustrates a first illustrative embodiment of the present invention. More particularly, an overstress detector 102 is coupled between a first power supply node 104 and a second power supply node 106. Typically first power supply node 104 is referred to as Vcc, second power supply node 106 is referred to as ground, and when in operation, the voltage at Vcc is positive with respect to ground. Overstress detector 102 has an input terminal which is coupled to an enable signal source at node 107. In operation, an enable signal is supplied at node 107 in order to disable the overstress detector during burn-in, and to enable it at other times. Overstress detector 102 has an output terminal which is coupled to node 110. A comparator 108 is coupled between Vcc 104 and ground 106. Comparator 108 has a first input terminal coupled to node 110, a second input terminal coupled to node 114, and an output terminal coupled to node 116. A reference voltage generator 112 is coupled between Vcc 104 and ground 106. Reference voltage generator 112 has an output terminal coupled to node 114.

Still referring to FIG. 1, when an overstress event or condition occurs, overstress detector 102 modifies itself such that a non-volatile record is made. Typically the recordation of an overstress event is performed by blowing a fuse within overstress detector 102. Because such a fuse, may be designed to blow (i.e., become electrically open, or enter a high impedance range of operation) at one of many possible predetermined ranges of current, it is possible to set a threshold for recordation of the overstress event. By providing several overstress detectors each set to different thresholds, it is possible to more accurately quantify the magnitude of the overstress event. Alternatively, a fuse device that provides non-volatile changes in its resistivity, rather than simply going to a high impedance state, can be used to provide an indication of the magnitude and/or duration of overstress events.

Figure 2:
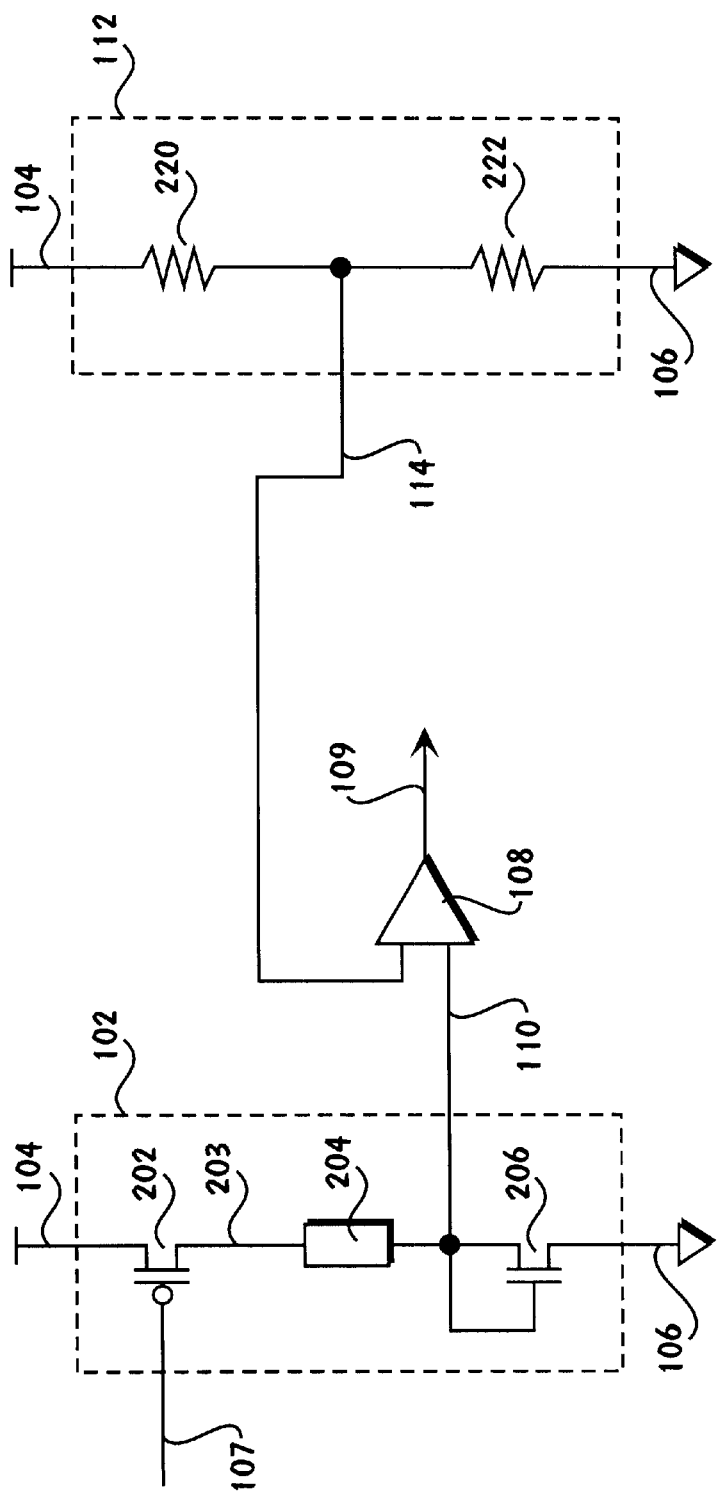
FIG. 2 is a transistor level schematic diagram of an EOS fuse sensor circuit in accordance with the present invention.

FIG. 2 shows a schematic diagram of an illustrative EOS fuse sensor circuit in accordance with the present invention. Overstress detector 102 has a PFET 202 coupled source-to-drain between Vcc 104 and an intermediate node 203. The gate of PFET 202 is coupled to a control signal source 107. A fuse 204 is coupled between intermediate node 203 and node 110. An NFET 206 is coupled drain-to-source between node 110 and ground 106. The gate and drain of NFET 206 are electrically tied together.

Fuse 204 is typically implemented as a segment of polysilicon having a cross-sectional area that defines the range of current at which it will blow. It will be appreciated that various geometries may be selected for the polysilicon to form the fuse. For example, a straight piece of polysilicon, a bow-tie shaped piece, a piece with 90 degree angles, or other shapes may be as used as are suitable for any particular semiconductor manufacturing process. Embodiments of the invention may use any suitable fuse structure or material compatible with the reliability requirements of a given manufacturing process. Similarly, with straightforward modifications to the overstress detector, an antifuse structure may be used in place of the fuse.

Still referring to FIG. 2, an exemplary implementation of reference voltage generator 112 is illustrated. The exemplary reference voltage generator is implemented as a voltage divider. More particularly, a first resistor 220 is coupled between Vcc 104 and node 114. A second resistor 222 is coupled between node 114 and ground 106. Resistors 220 and 222 may be formed from any suitable material available in a semiconductor manufacturing process. Typically such resistors are formed from polysilicon, however doped regions of the substrate, such as wells and junctions, may be used to form resistors. It will be appreciated that transistors coupled in series, and biased so as to conduct controlled amounts of current, may also be used to implement a voltage divider.

As shown in FIG. 2, a comparator 108 has a first input terminal coupled to node 114, which is the output node of the reference voltage generator 112. Comparator 108 has a second input terminal coupled to node 110, which is the output node of overstress detector 102. In operation, comparator 108 provides a signal at its output terminal 109, wherein the output signal is indicative of whether the fuse in overstress detector 102 has been altered by an overstress event. The electrical characteristics of PFET 202, fuse 204 and NFET 206 are chosen such that, in operation, the voltage at node 110 is greater than that at node 114 if no overstress event has been recorded, and is less if an overstress event has been recorded. For example, if PFET 202 is turned on, and fuse 204 has not been affected by an overstress event, then the voltage at node 110 rises until it is greater than the reference voltage.

The fuse used in the overstress detector will blow when more than a predetermined maximum allowable amount of current passes through it for a given amount of time. It will be appreciated that the maximum allowable current actually constitutes a range of current values. One reason for this is that there are manufacturing variabilities, or tolerances, which prevent each fuse from being identical. Another reason has to do with the heating necessary to blow the fuse. In this case a large overvoltage that exists for a very short time may be insufficient to blow the fuse, whereas a smaller overvoltage that exists for a longer time may provide the energy required to blow the fuse. Those skilled in the art and having the benefit of this disclosure will recognize that a particular fuse will have current threshold range that will cause the fuse to blow.

Figure 3:
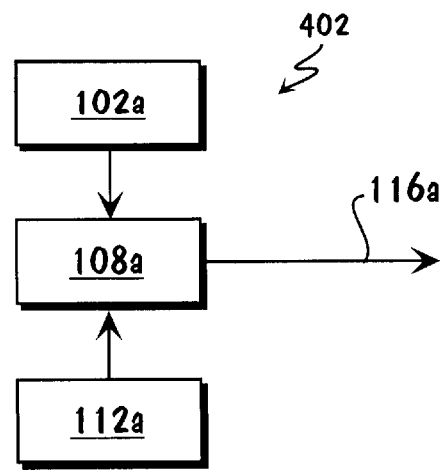
FIG. 3 is a block diagram showing a plurality of EOS fuse sensors wherein the fuses are set to detect different overstress thresholds.
Figure 3:
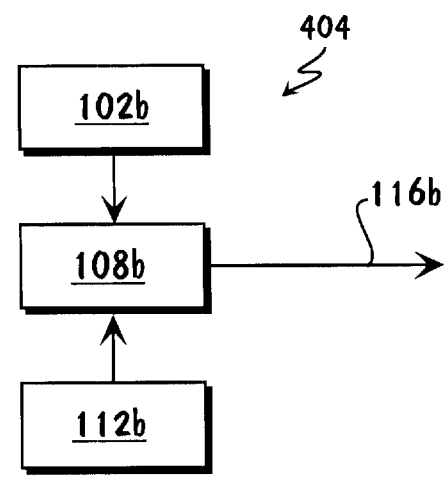
Figure 3:
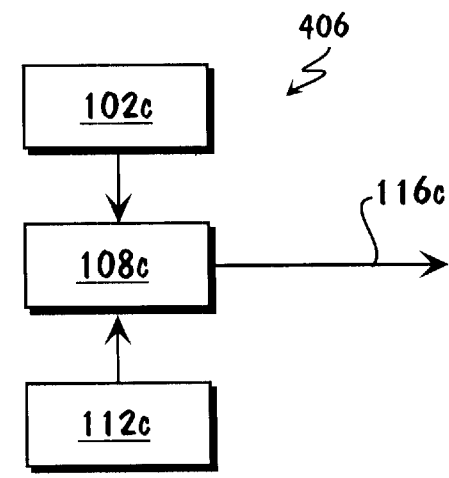

Although the EOS fuse sensor circuit is useful for identifying whether an overstress event or condition has occurred, one drawback is that only one threshold range is available. FIG. 3 shows several EOS fuse sensor circuits 402, 404, 406, which would typically be integrated onto a single chip. Each of EOS fuse sensor circuits 402, 404, 406 has a configuration such as that shown in FIGS. 1–2. More particularly, EOS fuse sensor circuits 402, 404, 406, each has an overstress detector 102*a*, 102*b*, 102*c*, respectively, that is set to a different overstress threshold. That is, by choosing the fuse such that it blows at a relatively low current, a relatively small overstress condition can be recorded, while by choosing a fuse that blows at a relatively high current, a relatively large overstress condition can be recorded. By including a range of fuses it is possible to quantify the size and duration of a particular overstress event.

Still referring to FIG. 3, the output signal nodes 116*a*, 116*b*, 116*c*, of comparator circuits 108*a*, 108*b*, 108*c*, may be coupled to an external connection terminal such as a bond pad, or a solder bump. If the information is to be stored, this may be done in any type of storage mechanism, including but not limited to a latch circuit, a static memory cell, a dynamic memory cell, a non-volatile memory cell, and so on.

Figure 4:
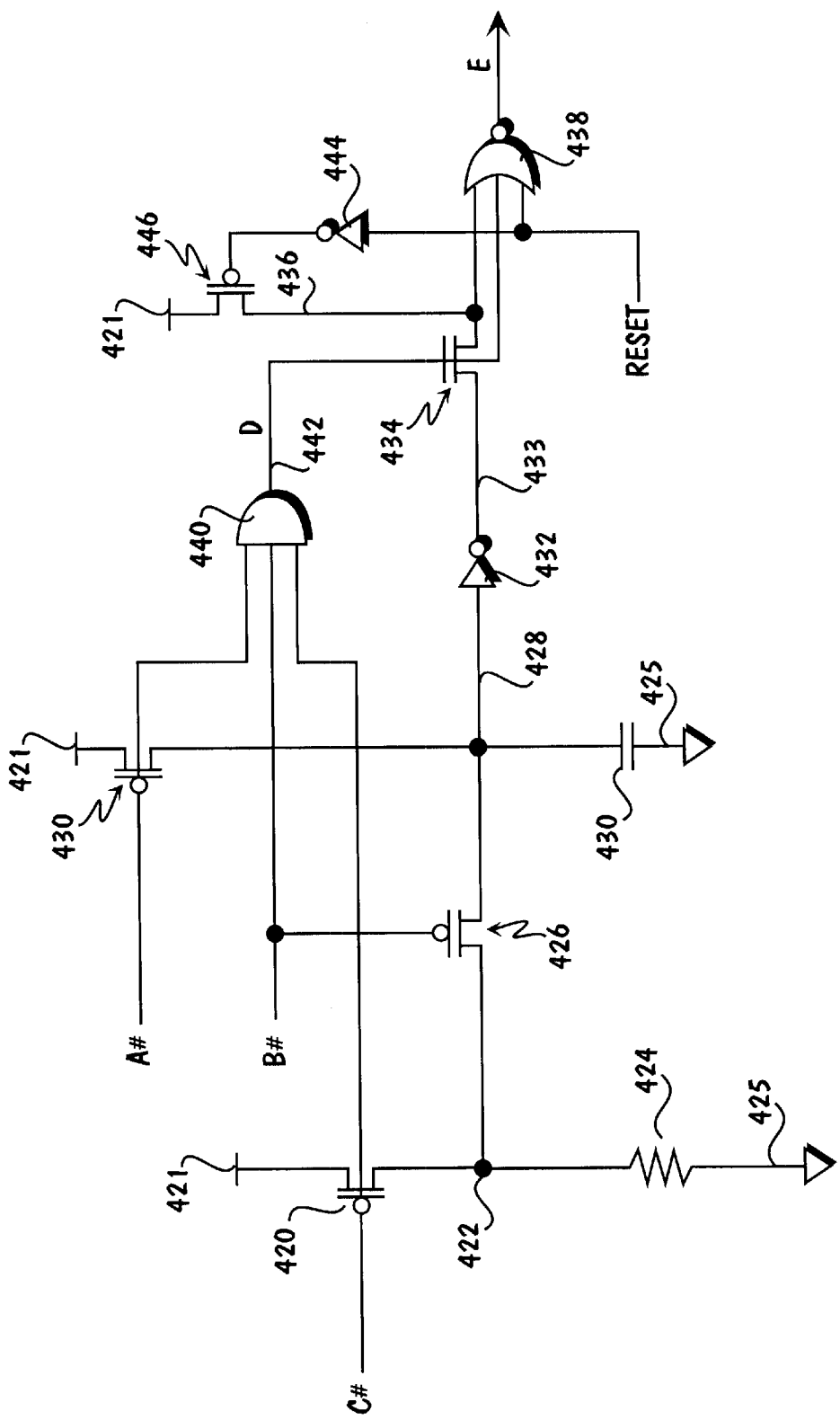
FIG. 4 is a schematic diagram illustrating an alternative embodiment of the present invention.

FIG. 4 shows an alternative circuit arrangement for detecting a change in the electrical characteristics of a fuse. More particularly, a PFET 420 is coupled source-to-drain between a node 421 and a node 422. A fuse, represented by resistor 424, is coupled between node 422 and a node 425. In this illustrative embodiment, node 421 is a power supply node such as Vcc, and node 425 is a power supply node such as ground. It will be appreciated that an EOS fuse can be coupled between any two nodes in a circuit, however a typical arrangement is to place an EOS between power supply nodes such as Vcc and ground.

A PFET 426 is coupled between node 422 and a node 428. A capacitor 425 is coupled between node 428 and ground 425. A PFET 430 is coupled source-to-drain between Vcc 421 and node 428. An inverter 432 has a input terminal coupled to node 428 and an output terminal coupled to node 433. An NFET is coupled between node 433 and node 436. A PFET 446 is coupled source-to-drain between Vcc 421 and node 436. The gate of PFET 446 is coupled to the output terminal of an inverter 444. Inverter 444 has an input terminal coupled to a signal source RESET.

The gate of PFET 430 is coupled to a signal source A#, the gate of PFET 426 is coupled to a signal source B#, and the gate of PFET 420 is coupled to a signal source C#. An AND gate 440 has input terminals coupled to each of signal sources A#, B#, and C#. AND gate 440 has an output terminal coupled to node 442. The gate of NFET 434 is coupled to node 442. A NOR gate 438 has input terminals coupled to node 442, node 436, and RESET as shown in FIG. 4.

In operation, the illustrative embodiment of the present invention shown in FIG. 4, monitors the power rails Vcc and ground for overstress events, or conditions, and when an overstress event occurs, the resistance of fuse 424 is changed. Typically the change to the resistivity of fuse 424 is from a relatively low resistance to a relatively high resistance. This change in resistance effectively records the occurrence of overstress. Subsequently, this recordation can be detected by the action of the remainder of the circuitry shown in FIG. 4 The signal source RESET generates a high active signal that forces the output of NOR gate 438 to a known state and initializes node 436 to high level indicative of no overstress. More particularly, capacitor 430 is charged to a high level through PFET 430 such that node 428 is at a high level with respect to ground. PFET 426 is turned on and PFETs 420 and 430 are turned off so that if an overstress event has been recorded node 428 will remain high, while if no overstress event has been recorded (i.e., fuse 424 has a low resistance) node 428 will be discharged. The voltage at node 428 serves as an input to inverter 428 which in turn has its output sampled by NFET 434 to provide a voltage at one of the input terminals of NOR gate 438. In the case of an overstress event having been recorded, capacitor 430 is not discharged, the output of inverter 432 remains low, and when the output of AND gate 440 (the signal that controls the sampling transistor NFET 434) goes low, the output of NOR gate 438 goes high, indicating an overstress event has been recorded.

FIG. 5 is a timing diagram indicating the relationships between the various control signals and the output signals generated by AND gate 440 and NOR gate 438.

Embodiments of the present invention may be used as part of a systemwide reliability check performed upon an electronic system. In such a configuration one or more integrated circuits embodying overstress detection circuits, in accordance with the present invention, report their reliability status, based at least in part on determining whether overstress events or conditions have occurred, to a system management device or to a system user. That is, information regarding overstress of an electronic device can be reported prior to a complete functional failure of the electronic device. Such information can be used to determine if replacement or repair should be made.

Conclusion

Embodiments of the present invention provide a warning in advance of system failure, permitting repair or replacement of an integrated circuit that has experience an overstress event or condition of any particular magnitude and duration.

Embodiments of the present invention include structures and circuitry that can determine whether an overstress event or condition has occurred, and that can communicate the occurrence of an overstress event or condition to other components or systems.

An advantage of embodiments of the present invention is that an early warning of a potential failure of a system can be given.

It will be understood by those skilled in the art that many design choices are possible within the scope of the present invention. For example, embodiments of the present invention may use fuses made of metal, or resistors made of doped single crystal silicon such as an n-well or a p-well, or capacitors made from any suitable structures such as transistors, metal to metal capacitors, metal to poly capacitors, poly to poly capacitors, and the like.

It will be understood that various other changes in the details, materials, and arrangements of the parts and steps which have been described and illustrated may be made by those skilled in the art without departing from the principles and scope of the invention as expressed in the subjoined claims.

What is claimed is:

1. A circuit, comprising:
   an overstress detector having at least two input terminals and an output terminal, the overstress detector comprising a first PFET coupled source-to-drain between a first node and a second node, a fuse coupled between the second node and a third node, a first NFET coupled drain-to-source between the third node and a fourth node, and wherein a gate of the first PFET is coupled to an enable signal source, and the gate of the first NFET is coupled to the drain of the first NFET;
   a reference voltage generator having an output terminal; and
   a comparator having a first input terminal coupled to the output terminal of the overstress detector, a second input terminal coupled to the output terminal of the reference voltage generator, and an output terminal;
   wherein the overstress detector generates a first voltage indicative of the absence of an overstress condition, and a second voltage indicative of an overstress condition.

2. The circuit of claim 1, wherein the overstress detector comprises a fuse which is operable to enter a high impedance region of operation in response to a current in excess of a predetermined value that is indicative of an overstress condition.

3. The circuit of claim 1, wherein the fuse comprises a polysilicon resistor.

4. The circuit of claim 1, wherein the reference voltage generator comprises a voltage divider.

5. The circuit of claim 1, wherein the overstress detector includes a nonvolatile memory element.

6. The circuit of claim 5, wherein the non-volatile memory element is a fuse.

7. The circuit of claim 6, wherein the overstress detector is coupled between power supply nodes.

8. An integrated circuit, comprising:
   a voltage comparator circuit having a first input terminal coupled to an output terminal of a first overstress detector, a second input terminal coupled to an output terminal of a reference voltage node, and an output terminal;
   the overstress detector comprising a first PFET coupled source-to-drain between a first node and a second node, a fuse coupled between the second node and a third node, a first NFET coupled drain-to-source between the third node and a fourth node, and wherein a gate of the first PFET is coupled to an enable signal source, and the gate of the first NFET is coupled to the drain of the first NFET.

9. The integrated circuit of claim 8, wherein the overstress detector comprises a means for detecting an overclocking event.

10. The integrated circuit of claim 8, wherein the overstress detector comprises a means for detecting an overvoltage event.

11. The integrated circuit of claim 8, wherein the overstress detector is coupled between power supply nodes.

* * * * *

UNITED STATES PATENT AND TRADEMARK OFFICE
CERTIFICATE OF CORRECTION

PATENT NO.    : 6,255,893 B1
DATED         : July 3, 2001
INVENTOR(S)   : Dishongh et al.

It is certified that error appears in the above-identified patent and that said Letters Patent is hereby corrected as shown below:

Column 2,
Line 44, delete "suicides", insert -- silicides --.

Signed and Sealed this

Fourth Day of June, 2002

Attest:

Attesting Officer

JAMES E. ROGAN
Director of the United States Patent and Trademark Office